US010082543B2

(12) United States Patent
Lee et al.

(10) Patent No.: US 10,082,543 B2
(45) Date of Patent: Sep. 25, 2018

(54) NON-CONTACT INTELLIGENT BATTERY SENSING SYSTEM AND METHOD

(71) Applicant: PROLIFIC TECHNOLOGY INC., Taipei (TW)

(72) Inventors: Yun-Kuo Lee, Hsinchu County (TW); Chia-Chang Hsu, Zhubei (TW); Ren-Yuan Yu, Hsinchu (TW); Ching-Te Chen, Hsinchu (TW); Ke-Ciang Shen, Taipei (TW)

(73) Assignee: Prolific Technology Inc. (TW)

( * ) Notice: Subject to any disclaimer, the term of this patent is extended or adjusted under 35 U.S.C. 154(b) by 23 days.

(21) Appl. No.: 15/498,624

(22) Filed: Apr. 27, 2017

(65) Prior Publication Data
US 2018/0180679 A1 Jun. 28, 2018

(30) Foreign Application Priority Data
Dec. 23, 2016 (TW) .............................. 105143112 A

(51) Int. Cl.
*G01N 27/416* (2006.01)
*G01R 31/36* (2006.01)
*G01R 33/00* (2006.01)

(52) U.S. Cl.
CPC ..... *G01R 31/3648* (2013.01); *G01R 31/3662* (2013.01); *G01R 33/0017* (2013.01)

(58) Field of Classification Search
CPC ............ G01R 31/007; G01R 31/3606; G01R 31/3648; G01R 19/165; G06F 11/00; G06F 11/30; G06F 11/0739; G06F 11/0778
See application file for complete search history.

(56) References Cited

U.S. PATENT DOCUMENTS

| | | | | |
|---|---|---|---|---|
| 2005/0218001 | A1* | 10/2005 | You ........................ | C25B 15/02 205/89 |
| 2010/0094575 | A1* | 4/2010 | Andrieu ............. | G01R 31/3668 702/63 |
| 2011/0074432 | A1* | 3/2011 | Tinnemeyer ....... | G01R 31/3606 324/426 |
| 2013/0278377 | A1* | 10/2013 | Slupsky ................ | G01B 21/32 340/5.1 |
| 2016/0002801 | A1* | 1/2016 | Grant ....................... | C25C 1/12 324/537 |

* cited by examiner

*Primary Examiner* — Minh N Tang

(57) ABSTRACT

In view of drivers cannot equip their vehicles with conventional intelligent battery monitoring system by themselves because the wire connections of the intelligent battery monitoring system are complex, the present invention particularly discloses a non-contact intelligent battery sensing system showing the advantages of simple circuit framework and low manufacturing cost. Since the non-contact intelligent battery sensing system only comprises a magnetic field sensor and a sensor controlling module, it is very easy for the drivers to equip their vehicles with this non-contact intelligent battery sensing system by themselves. To apply the non-contact intelligent battery sensing system, the driver just needs to firstly dispose the magnetic field sensor at one position near to a power line of a battery to be sensed, and then install a sensor controlling application program in his smart phones. Apparently, the non-contact intelligent battery sensing system further shows the advantage of easy to be installed.

14 Claims, 17 Drawing Sheets

NON-CONTACT INTELLIGENT BATTERY SENSING SYSTEM AND METHOD

BACKGROUND OF THE INVENTION

1. Field of the Invention

The present invention relates to the technology field of sensing circuits, and more particularly to a non-contact intelligent battery sensing system and method.

2. Description of the Prior Art

With the high development of modern technologies, batteries are getting more and more important and widely used in electrical or electronic products, such as motorcycles, automobiles, computers, cell phones, and so on. Lead-acid battery was invented in 1859 and is the oldest type of rechargeable battery. Ordinary lead-acid battery has a service life of 2-3 years, but that does not mean all commercial lead-acid batteries can be used for 2-3 years. Therefore, how to monitor the capacity of a lead-acid battery disposed in a vehicle becomes an important issue for automobile manufacturers.

Please refer to FIG. 1, which illustrates a framework diagram of a conventional intelligent battery monitoring system. As FIG. 1 shows, the intelligent battery monitoring system 100' is disclosed by U.S. patent publication No. US 2015/0323608 A1, and mainly comprises: an intelligent battery sensor (IBS) 120', a smart junction box (SJB) 130' and a multiplexer 140'. The IBS 120' is coupled between battery 110' and a plurality of load devices disposed in the vehicle, wherein the load devices comprises engine 154', synchronous generator 152', and other electrical devices 156'. In addition, the IBS 120' further comprises a BTM (battery thermal management) module 122', a SoC (State of Charge) module 124', a SoH (State of Health) module 126', and a fault factor analyzing module 128'.

According to disclosures of the U.S. patent publication No. US 2015/0323608 A1, the SJB 130' is particularly designed to a connection interface for facilitating the IBS 120' be easily coupled to difference load devices through a first switch SW1', a second switch SW2' and a third switch SW3'.

It is apparent that the disclosed intelligent battery monitoring system 100' is able to simultaneously monitor multi parameters of the between battery 110', including internal temperature, estimated SoC, and estimated SoH. However, inventors of the present invention still find that the intelligent battery monitoring system 100' taught by U.S. patent publication No. US 2015/0323608 A1 still includes some drawbacks and shortcomings as follows:

(1) The manufacturing cost of the intelligent battery monitoring system 100' is high because of having at least three integrated chips (ICs).
(2) Actually, if a driver of the vehicle equipped with the intelligent battery monitoring system 100' is not the person skilled in the technology field of battery monitoring systems, based on the information of internal temperature, estimated SoC, and estimated SoH, it is difficult for the driver to judge whether the battery 110' must be replaced by a new one or not.
(3) The driver cannot equip his car with the intelligent battery monitoring system 100' by himself because the wire connections of the intelligent battery monitoring system 100' are complex.

From above descriptions, it is easy to know that an ideal battery monitoring system just needs to show the driver that the battery's health state is good/not good, or tell the driver that the battery must be replaced by a new one. For above reasons, the inventors of the present application have made great efforts to make inventive research thereon and eventually provided a non-contact intelligent battery sensing system and method. It is worth explaining that, differing from conventional intelligent battery monitoring system 100' (as shown in FIG. 1) cannot be installed into a car by a car owner, it is very easy for the car owner to equip the car with the non-contact intelligent battery sensing system by himself. In addition, the car owner can also install an application program of a non-contact intelligent battery sensing method of the present invention in his smart phone.

SUMMARY OF THE INVENTION

In view of drivers cannot equip their vehicles with conventional intelligent battery monitoring system by themselves because the wire connections of the intelligent battery monitoring system are complex, the primary objective of the present invention is to disclose a non-contact intelligent battery sensing system showing the advantages of simple circuit framework and low manufacturing cost. Since the non-contact intelligent battery sensing system only comprises a magnetic field sensor and a sensor controlling module, it is very easy for the drivers to equip their vehicles with this non-contact intelligent battery sensing system by themselves. To apply the non-contact intelligent battery sensing system, the driver just needs to firstly dispose the magnetic field sensor at one position near to a power line of a battery to be sensed, and then install a sensor controlling application program in his smart phones. Apparently, the non-contact intelligent battery sensing system further indeed shows the advantage of easy to be applied.

In order to achieve the primary objective of the present invention, the inventor of the present invention provides one embodiment for the non-contact intelligent battery sensing system, which comprises:

a first magnetic field sensor, being disposed near a power line of a battery, and used for sensing a magnetic field formed around the power line so as to correspondingly output a magnetic field sensing signal; and a sensor controlling module, being coupled to the first magnetic field sensor for receiving the magnetic field sensing signal, and comprising;

a microprocessor, being coupled to the storage unit and comprising a feature parameter verifying unit and a battery state estimation unit; wherein the feature parameter verifying unit is configured to find out a plurality of feature parameters from a waveform characteristic of the magnetic field sensing signal, such that the battery state estimation unit is able to estimate a battery state according to the feature parameters; and an output unit, being coupled to the microprocessor for outputting the battery state to an external electronic device.

Moreover, for achieving the primary objective of the present invention, the inventor of the present invention provides one embodiment for the non-contact intelligent battery sensing method, which comprises following steps:

(1) using a sensor controlling module comprising a feature parameter verifying unit and a battery state estimation unit to control a magnetic field sensor to sense a magnetic field formed around a power line of a battery, and then receiving a magnetic field sensing signal outputted by the first magnetic field sensor;

(2) finding out a plurality of feature parameters from a waveform characteristic of the magnetic field sensing signal by using the feature parameter verifying unit of the sensor controlling module, so as to facilitate the battery state estimation unit estimate a battery state according to the feature parameters; and (3) outputting the battery state to an external electronic device through an output unit coupled to the sensor controlling module.

In the aforesaid embodiment, the non-contact intelligent battery sensing method further comprises following additional steps between the step (1) and the step (2):

(1a) determining whether the magnetic field sensing signal is normal or not; if yes, proceeding to the step (2); otherwise, proceeding to step (1b);

(1b) using the sensor controlling module to control a second magnetic field sensor to sense an external magnetic field; wherein the first magnetic field sensor is accommodated in a magnetic field shielding ring, and the second magnetic field sensor is coupled to the sensor controlling module, and further disposed near the power line and located at a specific position outside the magnetic field shielding ring;

(1c) determining whether or not the external magnetic field sensing signal is a noise magnetic field signal by comparing the first magnetic field sensing signal with the second magnetic field sensing signal; if yes, proceeding to step (1d); otherwise, proceeding back to the step (1);

(1d) adjusting the position of the first magnetic field sensor, and then repeating the step (1).

In the aforesaid embodiment of the non-contact intelligent battery sensing method, the step (2) comprises following detail steps:

(21) recording the feature parameters of discharge time, slope of discharge and maximum intensity of the magnetic field signal when the level of the magnetic field sensing signal is greater than a starting level;

(22) determining whether or not the waveform characteristic of the magnetic field sensing signal is an enable waveform characteristic based on the feature parameters of discharge time, slope of discharge and maximum intensity of the magnetic field signal; if yes, proceeding to step (23); otherwise, proceeding back to the step (1);

(23) recording the feature parameters of polarity of the magnetic field signal, slope of charge and charge time;

(24) stopping verifying and recording the feature parameters when the level of the magnetic field sensing signal is lower than an ending level;

(25) applying a feature mapping treatment to the plurality of feature parameters and a plurality of reference parameters by using a feature mapping unit of the sensor controlling module, so as to facilitate the battery state estimation unit estimate the battery state according to a feature mapping data provided by the feature mapping unit.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a non-contact intelligent battery sensing system and a non-contact intelligent battery sensing method according to the present invention, embodiments of the present invention will be described in detail with reference to the attached drawings hereinafter.

First Embodiment

Figure 2A:
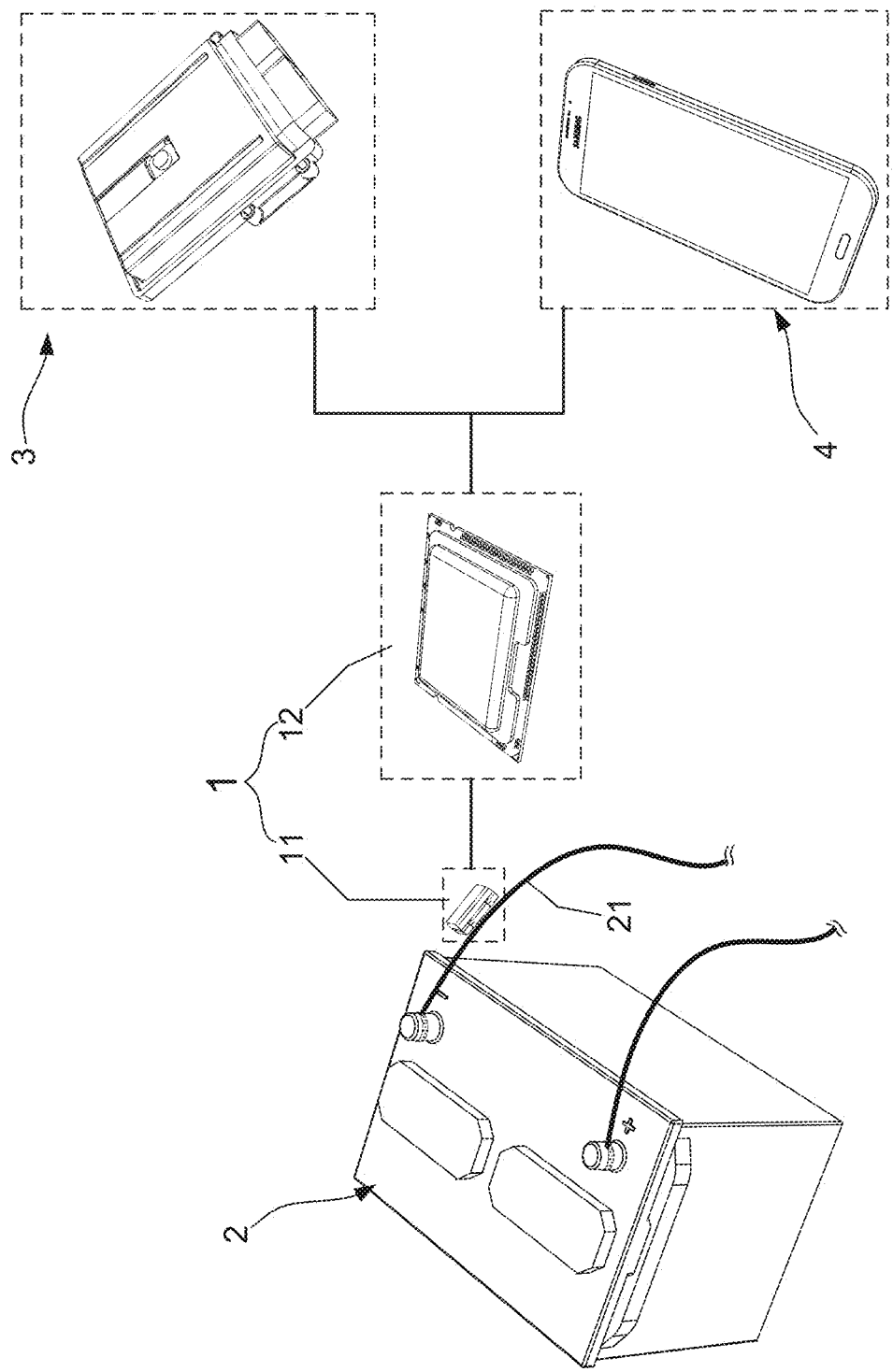
FIG. 2A shows one framework diagram of a first embodiment of a non-contact intelligent battery sensing system according to the present invention.
Figure 2B:
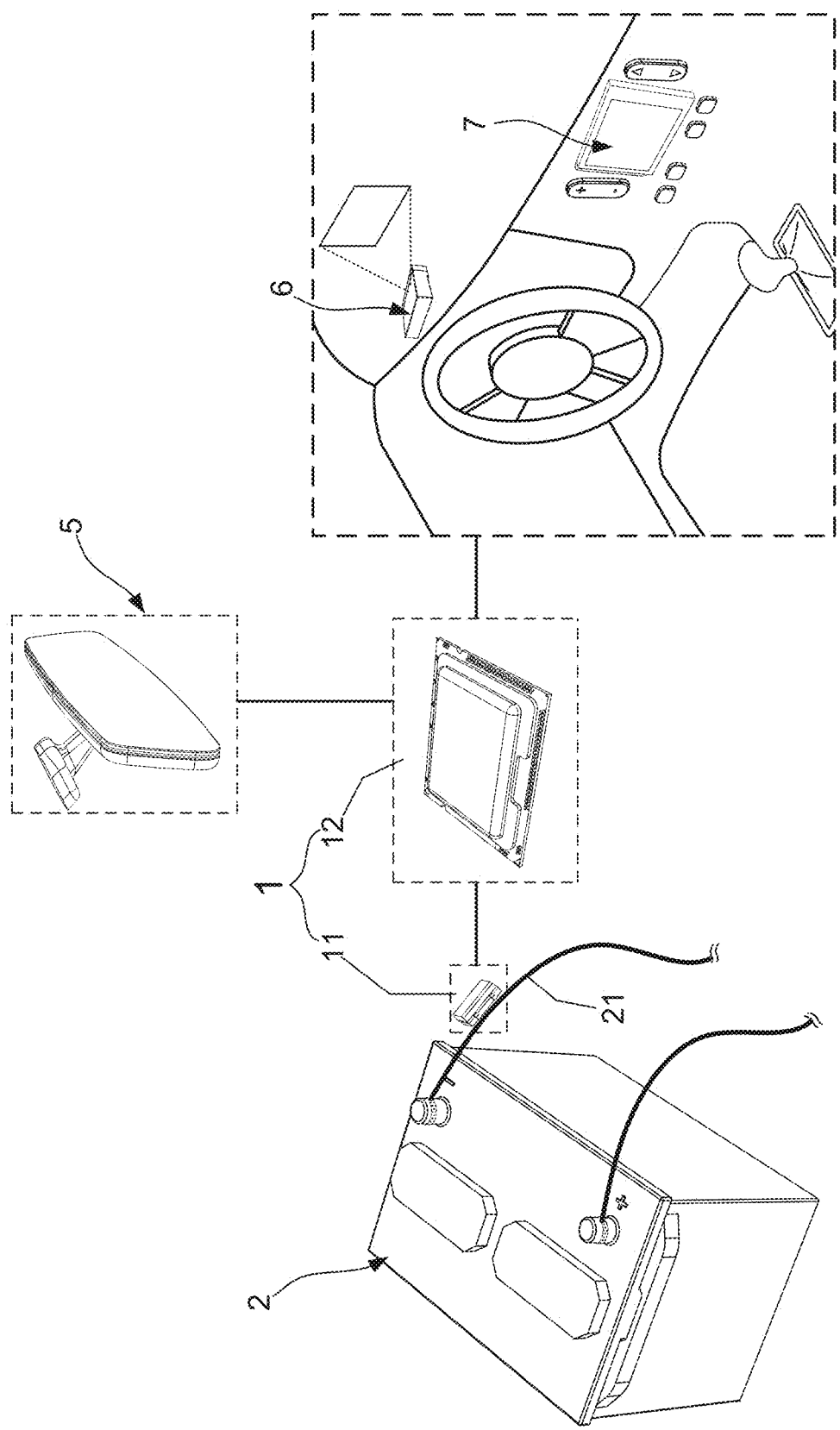
FIG. 2B shows another one framework diagram of the first embodiment of the non-contact intelligent battery sensing system.

Please refer to FIGS. 2A and 2B, where present two framework diagrams of a first embodiment of a non-contact intelligent battery sensing system according to the present invention. In the first embodiment of the present invention, the non-contact intelligent battery sensing system 1 is connected between a battery 2 and an electronic device. It is worth explaining that, because the battery 2 is disposed in a vehicle, the best practice model for the electronic device is an electronic control unit (ECU) 3 shown as FIG. 2A. Of course, as FIG. 2A shows, the electronic device can also be a portable electronic device 4 like notebook, tablet PC or smart phone. On the other hand, as FIG. 2B shows, the said electronic device can also be an automobile electronic products such as smart rearview mirror 5, head-up display (HUD) 6, central console display 7.

Figure 3:
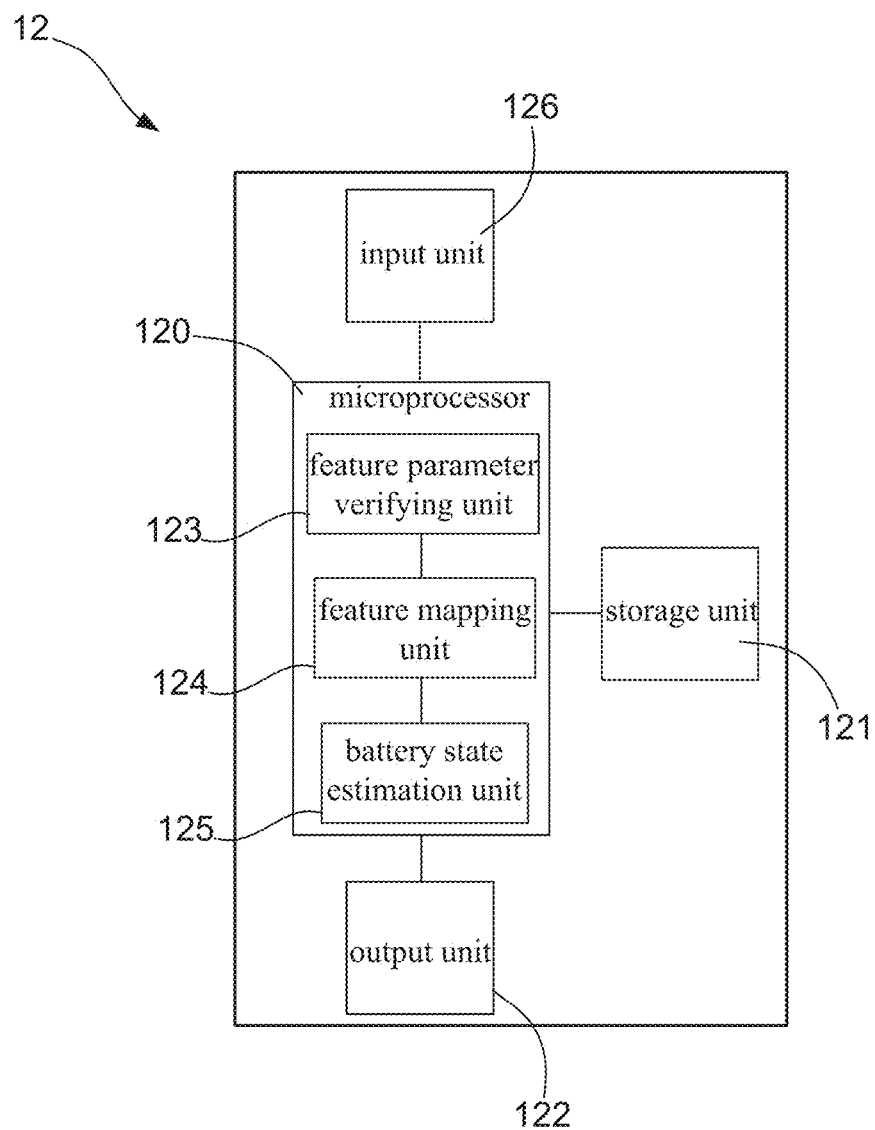
FIG. 3 shows a circuit block diagram of a sensor controlling module of the non-contact intelligent battery sensing system.

According to FIG. 2A, the non-contact intelligent battery sensing system 1 mainly comprises a first magnetic field sensor 11 and a sensor controlling module 12. Please simultaneously refer to FIG. 3, which illustrate a circuit block diagram of a sensor controlling module of the non-contact intelligent battery sensing system. As FIG. 3 shows, the sensor controlling module 12 comprises: an input unit 126, a microprocessor 120, a storage unit 121, and output unit 122. Herein it needs to explain that, in spite of FIG. 2A and FIG. 2B imply the sensor controlling module 12 is a hardware, which is not used for limiting the practice model of the sensor controlling module 12. When practice this non-contact intelligent battery sensing system 1, the sensor controlling module 12 can be applied in the portable electronic device 4 by a form of software, or installed in the ECU 3 by a form of firmware.

It is worth noting that, the first magnetic field sensor 11 is disposed near a power line 21 of the battery 2, and used for sensing a magnetic field formed around the power line 21 so as to correspondingly output a magnetic field sensing signal. Moreover, the sensor controlling module 12, comprising a feature parameter verifying unit 123, feature mapping unit 124 and a battery state estimation unit 125, is coupled to the first magnetic field sensor 11 for receiving the magnetic field sensing signal. After receiving the magnetic field sensing signal, the microprocessor 120 would verifying whether the magnetic field sensing signal is normal or not, and then stores normal magnetic field sensing signal into the storage unit 121. Subsequently, the microprocessor 120 is configured to find out a plurality of feature parameters from a waveform characteristic of the magnetic field sensing signal, and eventually estimate a battery state of the battery 2 based on the feature parameters. According to a waveform graph of a normal magnetic field sensing signal presented by FIG. 4, the aforesaid feature parameters are defined and listed in following Table (1).

TABLE (1)

Figure 4:
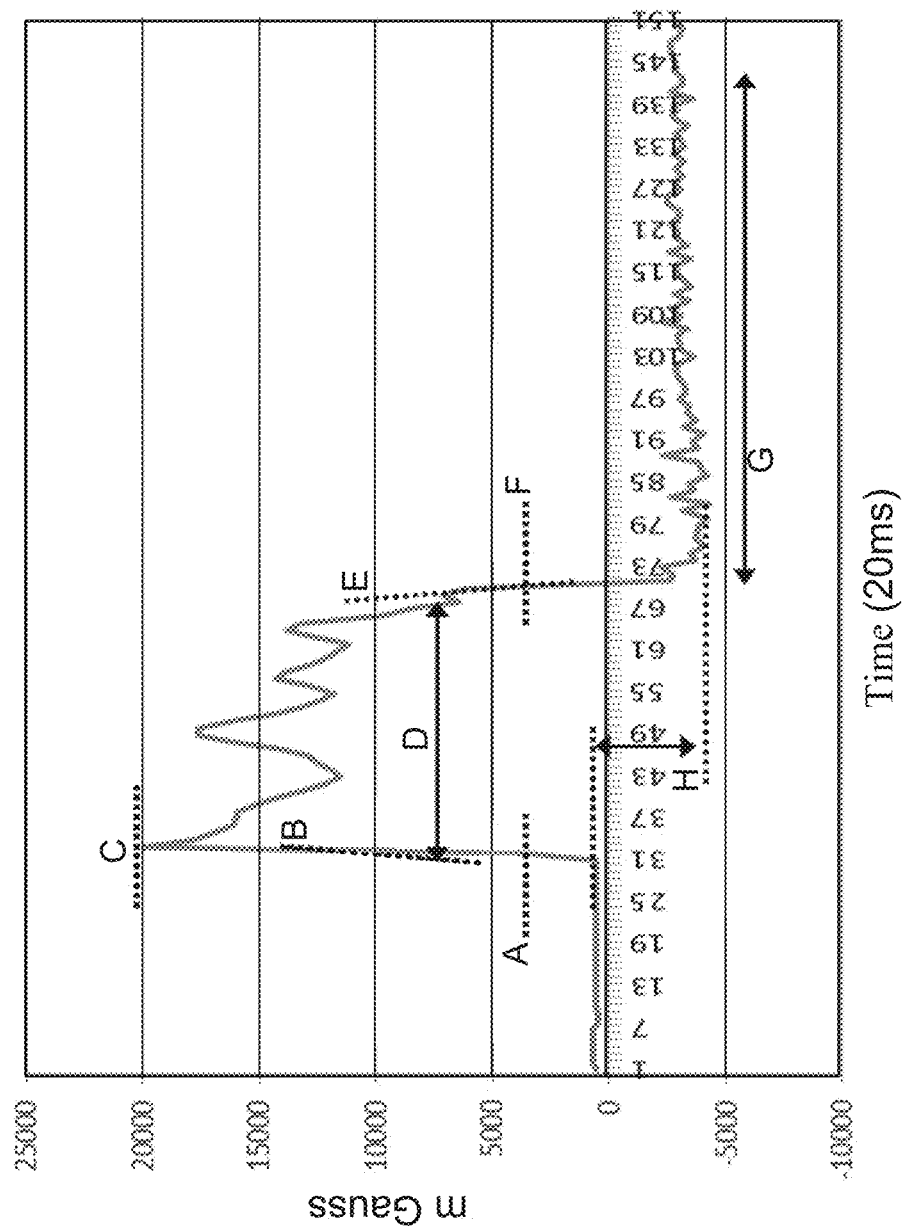
FIG. 4 shows a waveform graph of a normal magnetic field sensing signal.

| Symbol in FIG. 4 | Defined feature parameters |
|---|---|
| A | Starting level of the magnetic field signal |
| B | Slop of discharge |
| C | maximum intensity of of the magnetic field signal |
| D | Discharge time |
| E | Slop of charge |
| F | ending level of the magnetic field signal |
| G | Charge time |
| H | Charge level |

As electronic engineers skilled in development or application of microcontroller, the feature parameter verifying unit 123, the feature mapping unit 124 and the battery state estimation unit 125 can be applied in the microprocessor 120 by any one form of firmware, software, library, or circuit unit. In the present invention, the feature parameter verifying unit 123 is configured to find out a plurality of feature parameters from a waveform characteristic of the magnetic field sensing signal, such that the feature mapping unit 124 coupled to the feature parameter verifying unit 123 is able to apply a feature mapping treatment to the plurality of feature parameters and a plurality of reference parameters. Thus, based on a feature mapping data produced by the feature mapping unit 124, the battery state estimation unit 125 coupled to the feature mapping unit 124 estimate a battery state of the battery 2. For example, the said estimated battery state may be a downgrade state, an upgrade state or a normal grade state.

After completing the estimation of the battery state, microprocessor 120 outputs related data of the battery state to an external electronic device such as a portable electronic device 4 through the output unit 122. Herein the said output unit 122 means a wireless transmission interface like WIFI or Bluetooth interface or a wire transmission interface such as USB or Lightning connector.

Second Embodiment

Figure 5:
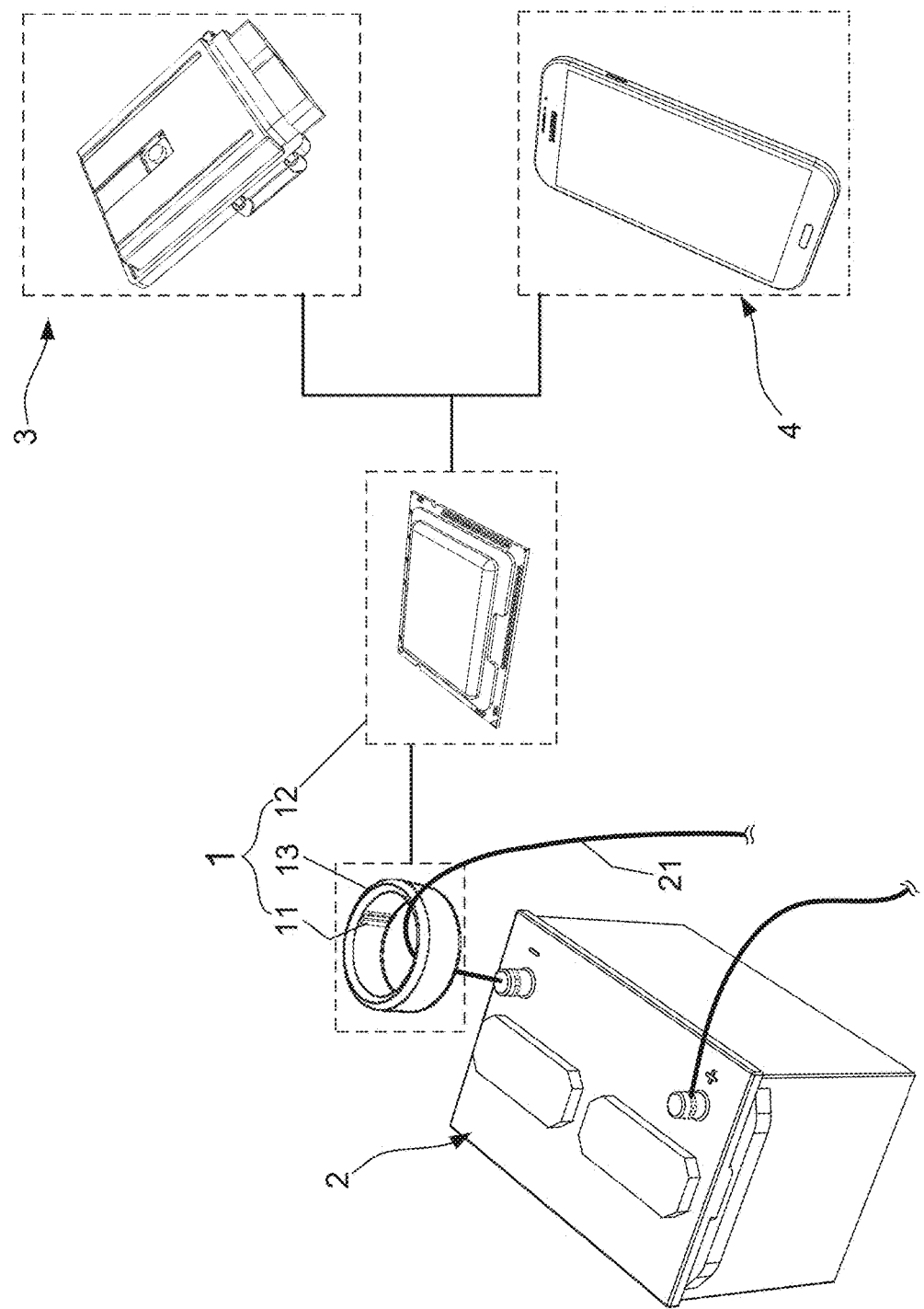
FIG. 5 shows a framework diagram of a second embodiment of the non-contact intelligent battery sensing system.

Please refer to FIG. 5, where present a framework diagram of a second embodiment of the non-contact intelligent battery sensing system. In the second embodiment of the present invention, the non-contact intelligent battery sensing system 1 further comprises a magnetic field shielding ring 13. As FIG. 5 shows, the first magnetic field sensor 11 is accommodated in the magnetic field shielding ring 13, and the power line 21 passes through the magnetic field shielding ring 13. By the arrangement of the magnetic field shielding ring 13, noise magnetic field is blocked by the magnetic field shielding ring 13, and then the sensitivity and the sensing accuracy of the first magnetic field sensor 11 is obviously enhanced.

Third Embodiment

Figure 6:
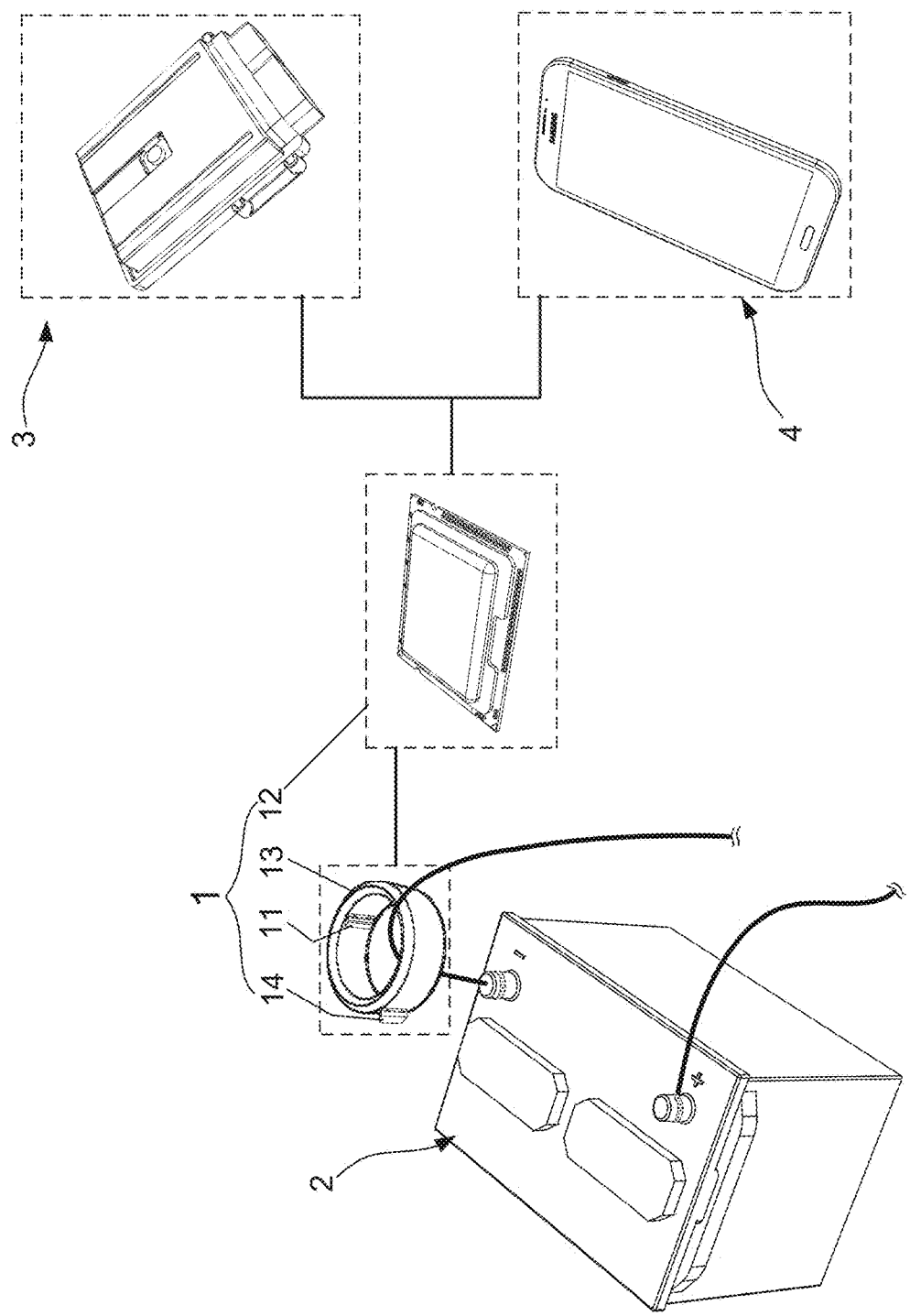
FIG. 6 shows a framework diagram of a third embodiment of the non-contact intelligent battery sensing system.

FIG. 6 shows a framework diagram of a third embodiment of the non-contact intelligent battery sensing system. In the third embodiment of the present invention, the non-contact intelligent battery sensing system 1 further comprises a second magnetic field sensor 14. The second magnetic field sensor 14 is coupled to the sensor controlling module 12 and disposed near the power line 21 and located at a position outside the magnetic field shielding ring 13, and is configured to sense an external magnetic field formed outside the magnetic field shielding ring 13. Therefore, by comparing the first magnetic field sensing signal with the external magnetic field sensing signal, the microprocessor 120 is able to verify whether the external magnetic field sensing signal is a noise magnetic field signal or not. Subsequently, when the first magnetic field sensor is influenced by the noise magnetic field signal, the microprocessor 120 would inform user to adjusting the position of the first magnetic field sensor 11. Herein, it needs to further explain that, both the first magnetic field sensor 11 and the second magnetic field sensor 12 have a signal outputting unit, which can be a wireless outputting interface or a wire outputting interface.

Fourth Embodiment

Figure 7:
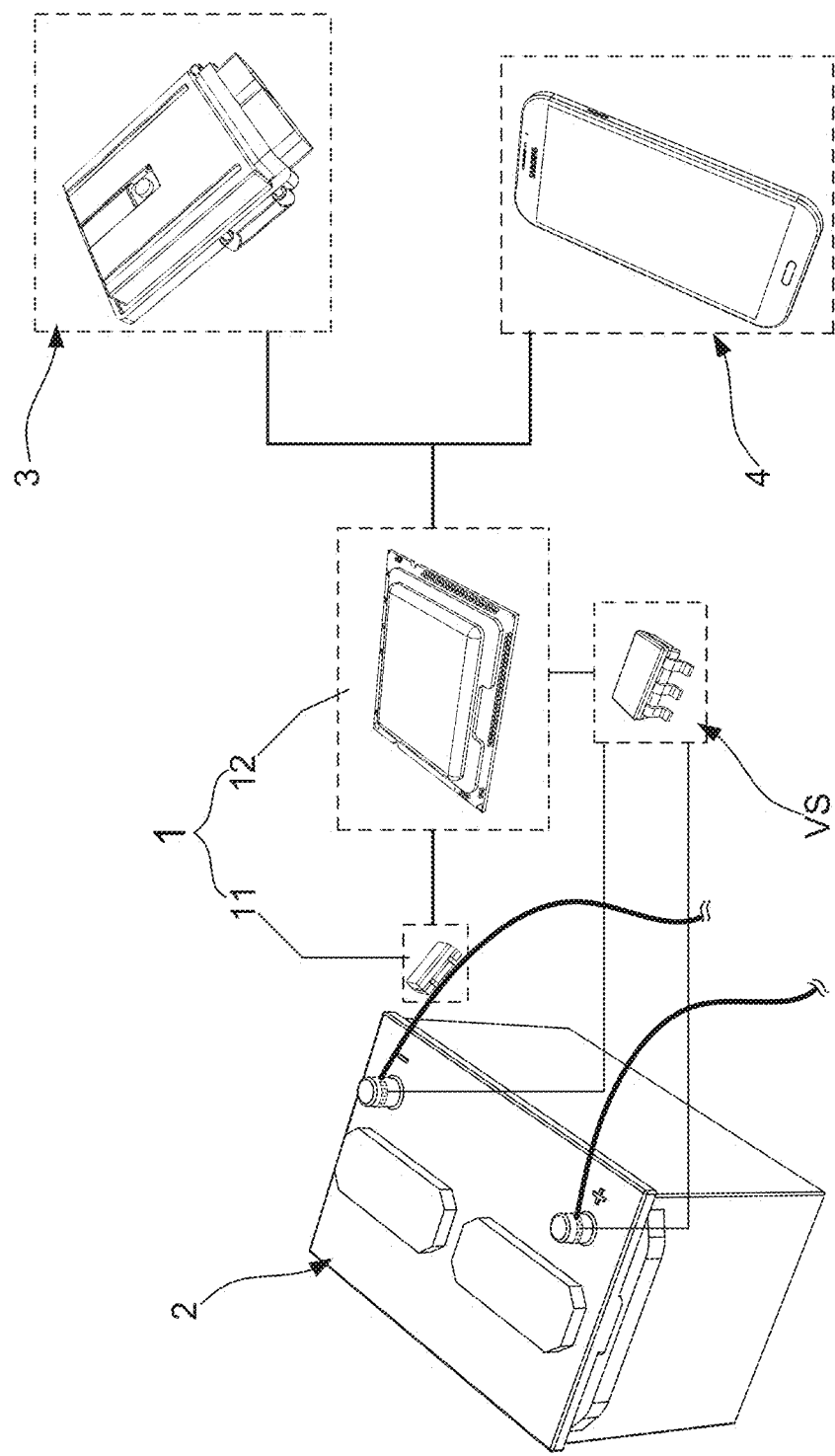
FIG. 7 shows a framework diagram of a fourth embodiment of the non-contact intelligent battery sensing system.
Figure 8:
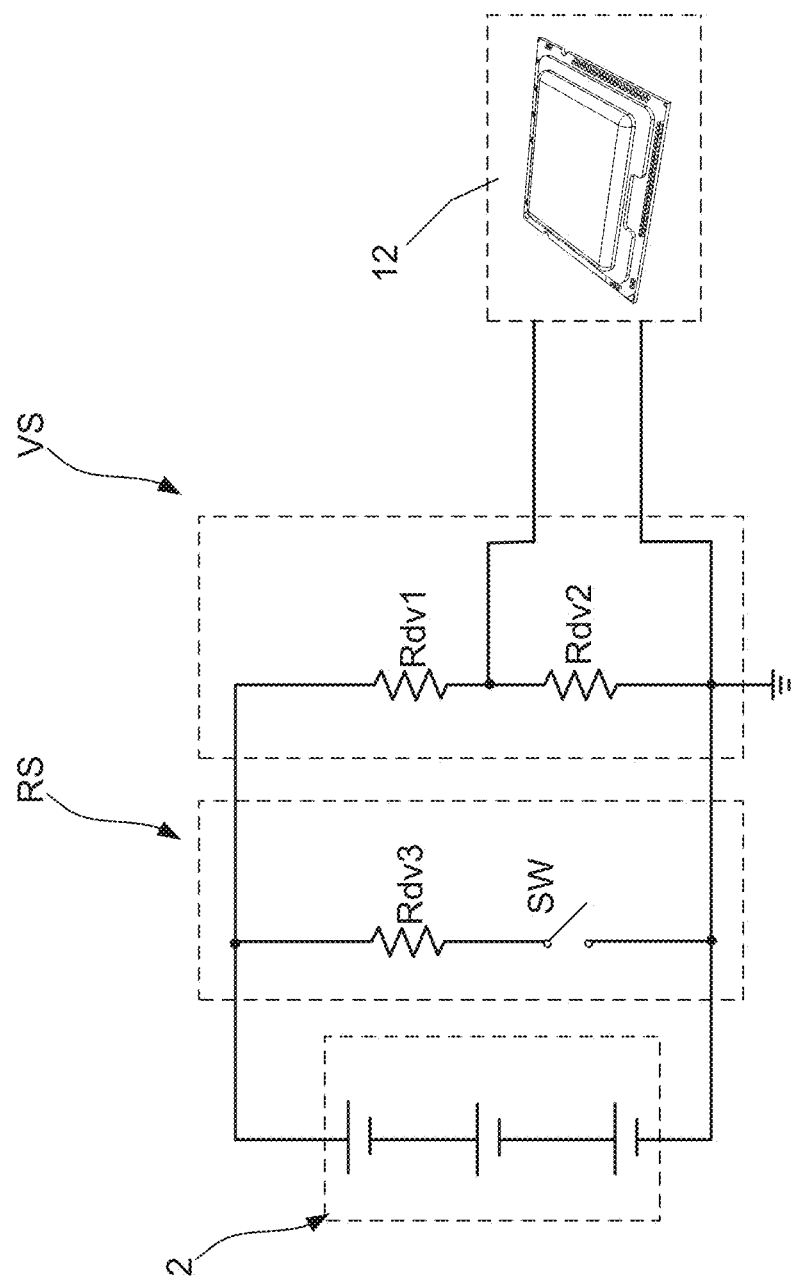
FIG. 8 shows a circuit framework diagram of a voltage sensor.

FIG. 7 shows a framework diagram of a fourth embodiment of the non-contact intelligent battery sensing system. In the fourth embodiment of the present invention, the non-contact intelligent battery sensing system 1 further comprises a voltage sensor VS, which is coupled to the sensor controlling module 12 and electrically connected to the battery 2. Moreover, according to the circuit framework diagram of the voltage sensor shown in FIG. 8, it is able to know that the voltage sensor VS mainly comprises a first resistor Rdv1 and a second resistor Rdv2. In addition, an internal resistor sensor RS comprising a third resistor Rdv3 and a switch SW can be integrated into the chip of the voltage sensor VS. By the arrangement of the voltage sensor VS and the internal resistor sensor RS, the non-contact intelligent battery sensing system 1 is able to measure a battery internal resistance of the battery 2 by using the sensor controlling module 12 to input a resistance detecting signal into the battery 2, such as an AC signal or DC signal.

Figure 9A:
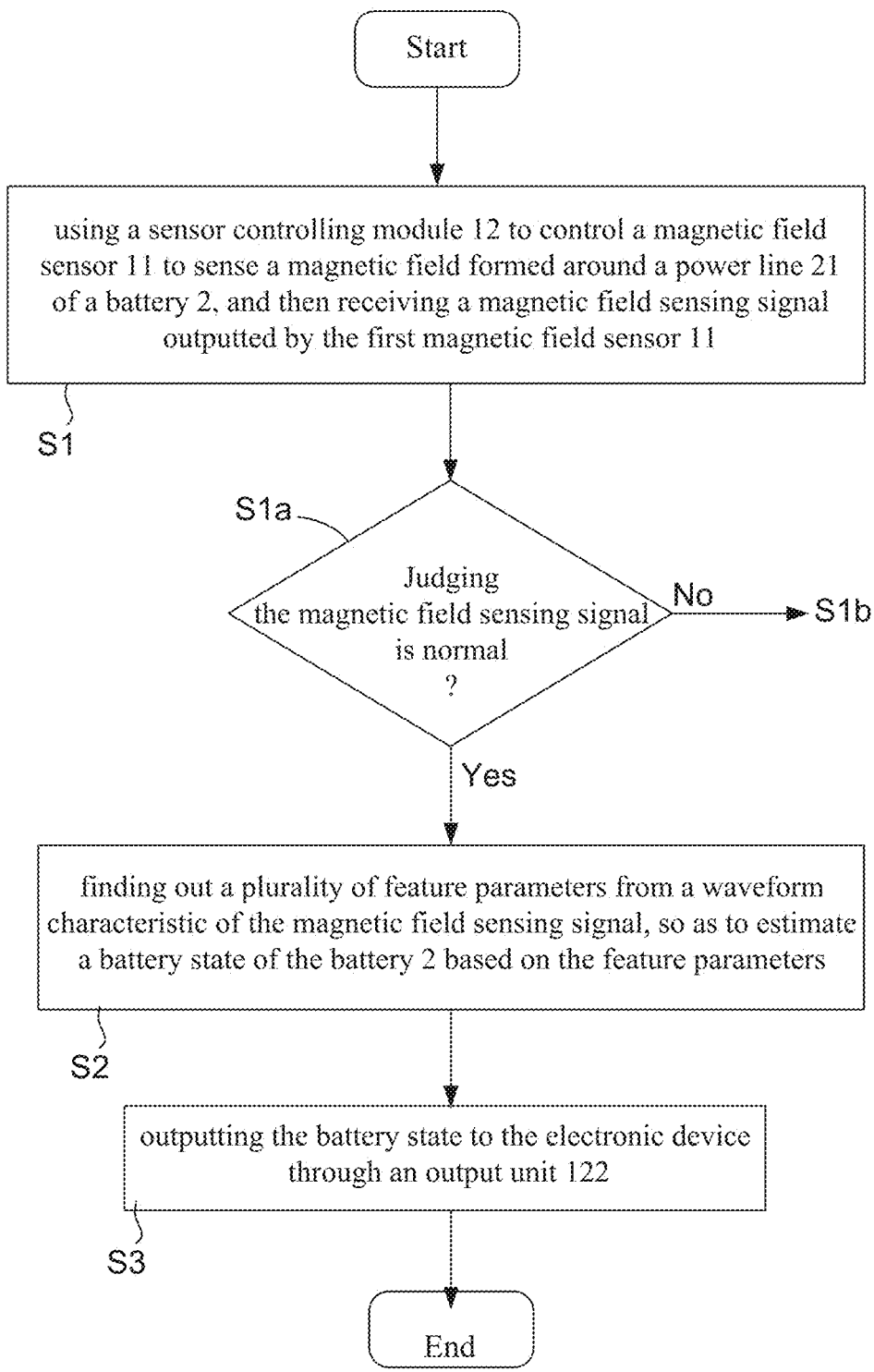
FIG. 9A and FIG. 9B show flow charts of a first embodiment of a non-contact intelligent battery sensing method according to the present invention.
Figure 9B:
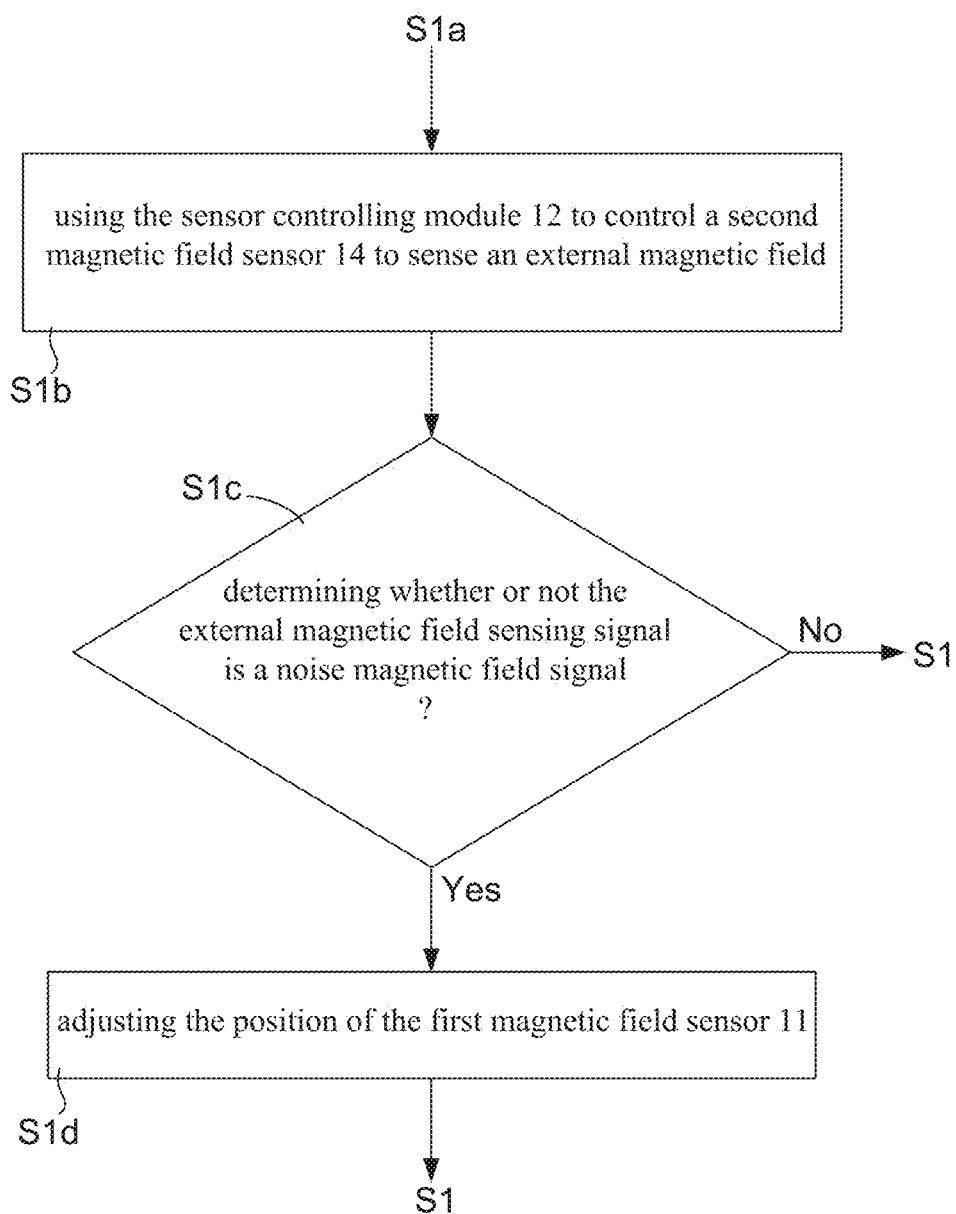

Thus, above descriptions have introduced several embodiments of the non-contact intelligent battery sensing system 1 completely and clearly; continuously, a non-contact intelligent battery sensing method of the present invention will be described in following paragraphs. FIG. 9A and FIG. 9B show flow charts of a first embodiment of the non-contact intelligent battery sensing method. In the first embodiment, the non-contact intelligent battery sensing method comprising following steps:

Step (S1): using a sensor controlling module 12 comprising a feature parameter verifying unit 123, a feature mapping unit 124 and a battery state estimation unit 125 to control a magnetic field sensor 11 to sense a magnetic field formed around a power line 21 of a battery 2, and then receiving a magnetic field sensing signal outputted by the first magnetic field sensor 11;

Step (S1a): using the sensor controlling module 12 to verify whether the magnetic field sensing signal is normal or not; if yes, proceeding to step (S2); otherwise, proceeding to step (S1b);

Step (S1b): using the sensor controlling module 12 to control a second magnetic field sensor 14 to sense an external magnetic field; wherein the first magnetic field sensor 11 is accommodated in a magnetic field shielding ring 13, and the second magnetic field sensor 14 is coupled to the sensor controlling module 12, and further disposed near the power line 21 and located at a specific position outside the magnetic field shielding ring 13;

Step (S1c): determining whether or not the external magnetic field sensing signal is a noise magnetic field signal by comparing the first magnetic field sensing signal with the external magnetic field sensing signal; if yes, proceeding to step (S1d); otherwise, proceeding back to the step (S1);

Step (S1d): adjusting the position of the first magnetic field sensor 11, and then repeating the step (S1);

Step (S2): finding out a plurality of feature parameters from a waveform characteristic of the magnetic field sensing signal by using the feature parameter verifying unit 123 of the sensor controlling module 12 and then the feature mapping unit 124 apply a feature mapping treatment to the plurality of feature parameters and a plurality of reference parameters; therefore, the battery state estimation unit subsequently estimate a battery state of the battery 2 according to the feature parameters;

Step (S3): outputting the battery state to an external electronic device through an output unit 122 of the sensor controlling module 12.

It is easy to understand that the method steps shown in FIG. 9A and FIG. 9B are adopted for controlling the non-contact intelligent battery sensing system 1 having the framework shown as FIG. 6 to carry out a battery state estimating process. Based on the particular framework design, the microprocessor 120 is able to verify whether or not the external magnetic field sensing signal is a noise magnetic field signal by comparing the first magnetic field sensing signal with the external magnetic field sensing signal. When the first magnetic field sensor is influenced by the noise magnetic field signal, the microprocessor 120 would inform user to adjusting the position of the first magnetic field sensor 11. By the arrangement of the magnetic field shielding ring 13, noise magnetic field is blocked by the magnetic field shielding ring 13, such that the sensitivity and the sensing accuracy of the first magnetic field sensor 11 is obviously enhanced.

Figure 10:
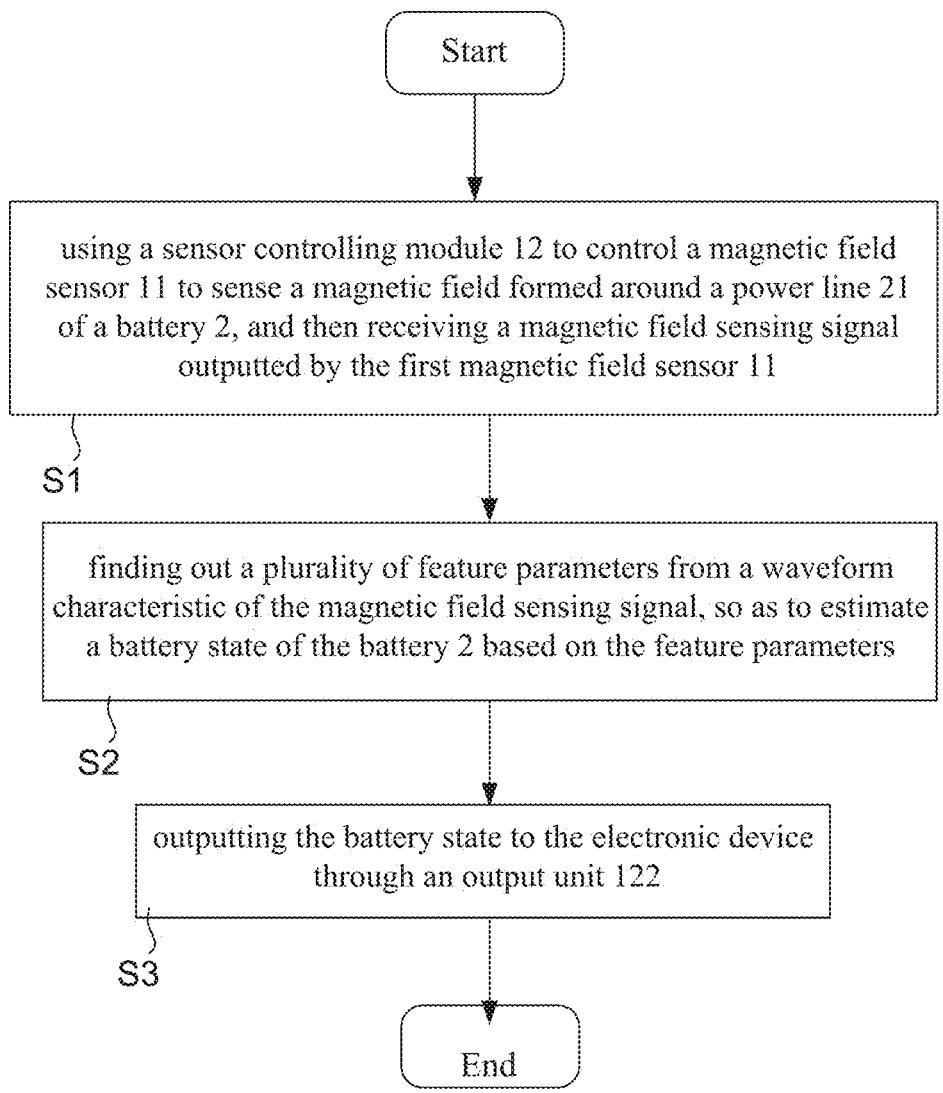
FIG. 10 shows a flow chart of a second embodiment of the non-contact intelligent battery sensing method.

Please continuously refer to FIG. 10, which illustrate a flow chart of a second embodiment of the non-contact intelligent battery sensing method. It is worth explaining that the method steps shown in FIG. 10 are adopted for controlling the non-contact intelligent battery sensing system 1 having the framework shown as FIG. 2A and FIG. 2B to finish a battery state estimating process. However, in spite of the second embodiment and the first second embodiment are different in some primary executing steps, the step (2) in the second embodiment and the first second embodiment comprises following detail steps:

Step (S21): recording the feature parameters of discharge time, slope of discharge and maximum intensity of the magnetic field signal when the level of the magnetic field sensing signal is greater than a starting level;

Step (S22): determining whether or not the waveform characteristic of the magnetic field sensing signal is an enable waveform characteristic based on the feature parameters of discharge time, slope of discharge and maximum intensity of the magnetic field signal; if yes, proceeding to step (S23); otherwise, proceeding back to the step (S1);

Step (S23): recording the feature parameters of polarity of the magnetic field signal, slope of charge and charge time;

Step (S24): stopping verifying and recording the feature parameters when the level of the magnetic field sensing signal is lower than an ending level;

Step (S25): applying a feature mapping treatment to the plurality of feature parameters and a plurality of reference parameters by using the feature mapping unit 124 of the sensor controlling module 12, so as to facilitate the battery state estimation unit 125 estimate the battery state according to a feature mapping data provided by the feature mapping unit 124.

Herein, it needs to further explain that the reference parameters mentioned in the step (S25) are listed in following Table (2).

TABLE (2)

| Reference parameters | Value | Judgment criteria for verifying whether the measured magnetic field sensing signal is normal or not |
|---|---|---|
| Starting level of the magnetic field signal | 5 Gauss | >5 Gauss |
| Slop of discharge | 5 Gauss/ms | >5 Gauss/ms |
| maximum intensity of of the magnetic field signal | 15 Gauss | >15 Gauss |
| Discharge time | 2 sec | >2 sec |
| Slop of charge | −1 Gauss/ms | <−1 Gauss/ms |
| ending level of the magnetic field signal | 5 Gauss | <5 Gauss |
| Charge time | 600 ms | >600 ms |
| Battery voltage | 12.5 Volt | >12.5 Volt |
| Charge level | 1 Gauss | >1 Gauss |

It is very reasonable that the reference parameter values listed in Table (2) would change according to various types of different batteries. For instance, the reference parameter values of a lead-acid battery must be different from a silver calcium battery's. Furthermore, for proving the practicability of the non-contact intelligent battery sensing system and method proposed by the present invention, the inventors have carried out battery state estimating processes of a variety of commercial batteries by utilizing this non-contact intelligent battery sensing system 1.

Figure 11:
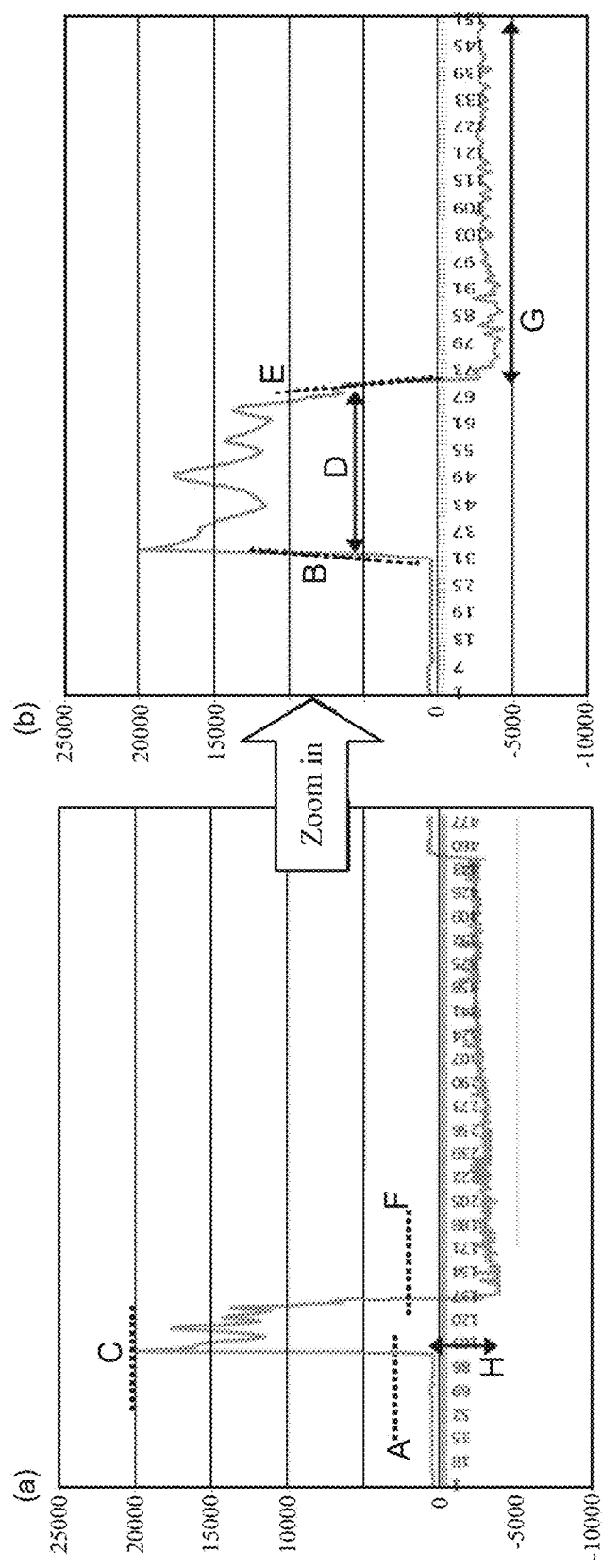
FIG. 11 shows a waveform graph of the magnetic field sensing signal measured from a first commercial battery.

FIG. 11 shows a waveform graph of a magnetic field sensing signal measured from a first commercial battery. In FIG. 11, the unit of vertical axis is "mGauss" and the unit of horizontal axis is "20 ms". Therefore, the feature parameters found out from the waveform characteristic of the magnetic field sensing signal shown in FIG. 11 are listed in following Table (3).

TABLE (3)

| Symbol in FIG. 11 | feature parameters | Value |
|---|---|---|
| A | Starting level of the magnetic field signal | >5 Gauss |
| B | Slop of discharge | >5 Gauss/ms |
| C | maximum intensity of of the magnetic field signal | >15 Gauss |
| D | Discharge time | <2 sec |
| E | Slop of charge | <−1 Gauss/ms |
| F | ending level of the magnetic field signal | <5 Gauss |
| G | Charge time | >600 ms |
| H | Charge level | >1 Gauss |
| — | Battery voltage | >12.5 V |

Figure 12:
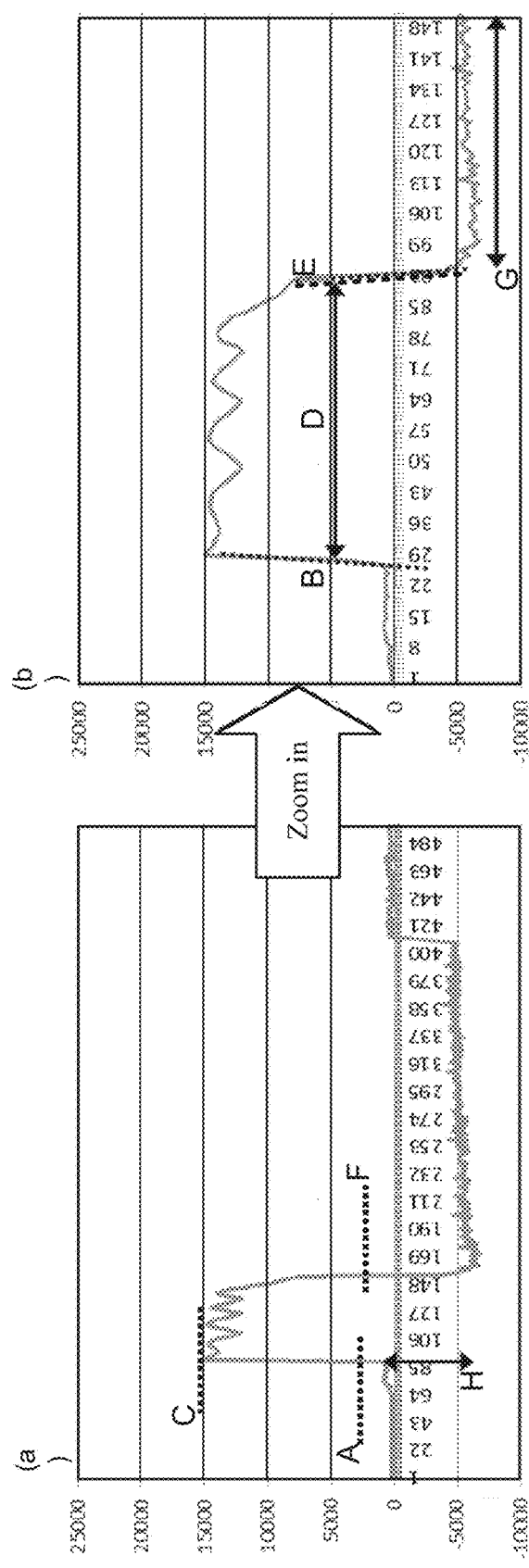
FIG. 12 shows a waveform graph of the magnetic field sensing signal measured from a second commercial battery.

After applying a feature mapping treatment to the measured feature parameters and a plurality of reference parameters listed in above Table (2), the health state of the first commercial battery is estimated to be good. On the other hand, FIG. 12 shows a waveform graph of a magnetic field sensing signal measured from a second commercial battery. Therefore, the feature parameters found out from the waveform characteristic of the magnetic field sensing signal shown in FIG. 12 are listed in following Table (4).

TABLE (4)

| Symbol in FIG. 12 | feature parameters | Value |
|---|---|---|
| A | Starting level of the magnetic field signal | > Gauss |
| B | Slop of discharge | >5 Gauss/ms |
| C | maximum intensity of of the magnetic field signal | <15 Gauss |
| D | Discharge time | <2 sec |
| E | Slop of charge | <−1 Gauss/ms |
| F | ending level of the magnetic field signal | <5 Gauss |
| G | Charge time | >600 ms |
| H | Charge level | >1 Gauss |
| — | Battery voltage | >12.5 V |

Therefore, after applying a feature mapping treatment to the measured feature parameters and a plurality of reference parameters listed in above Table (2), the health state of the second commercial battery is estimated to be between good and bad.

Figure 13:
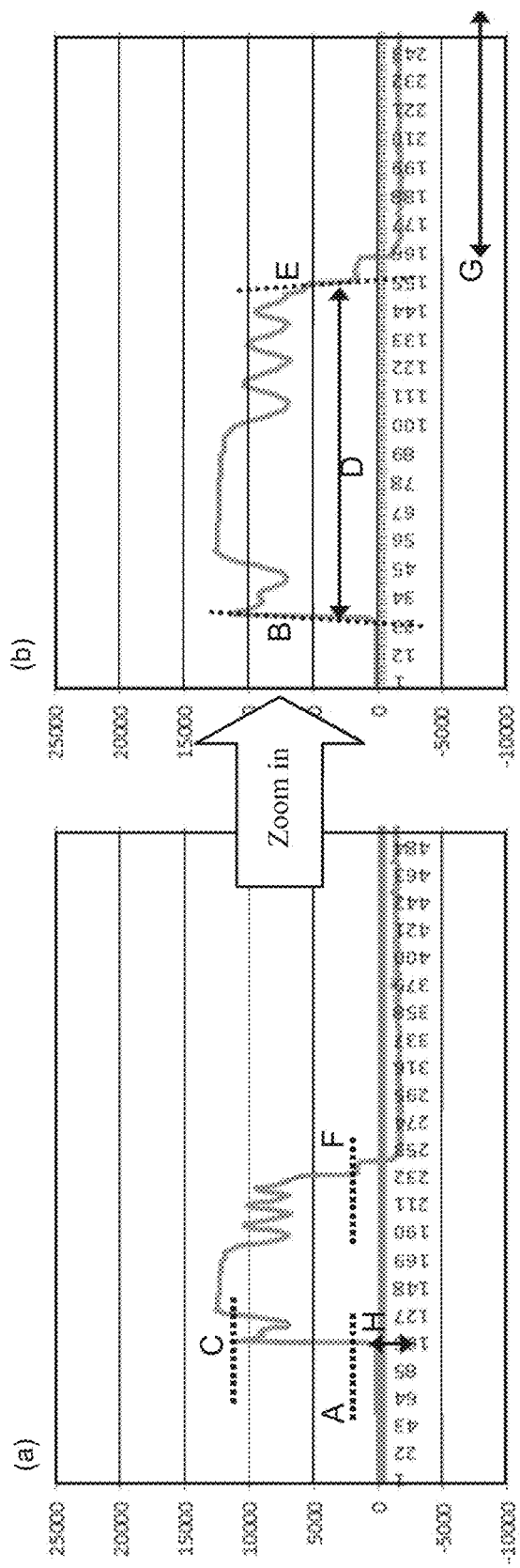
FIG. 13 shows a waveform graph of the magnetic field sensing signal measured from a third commercial battery.

Furthermore, FIG. 13 shows a waveform graph of a magnetic field sensing signal measured from a third commercial battery. Therefore, the feature parameters found out from the waveform characteristic of the magnetic field sensing signal shown in FIG. 13 are listed in following Table (5).

TABLE (5)

| Symbol in FIG. 13 | feature parameters | Value |
|---|---|---|
| A | Starting level of the magnetic field signal | >5 Gauss |
| B | Slop of discharge | >5 Gauss/ms |
| C | maximum intensity of of the magnetic field signal | <15 Gauss |
| D | Discharge time | >2 sec |
| E | Slop of charge | <−1 Gauss/ms |
| F | ending level of the magnetic field signal | <5 Gauss |
| G | Charge time | >600 ms |
| H | Charge level | >1 Gauss |
| — | Battery voltage | >12.5 V |

After applying a feature mapping treatment to the measured feature parameters and a plurality of reference parameters listed in above Table (2), the health state of the third commercial battery is also estimated to be between good and bad. In addition, FIG. 14 shows a waveform graph of a magnetic field sensing signal measured from a fourth commercial battery, and the feature parameters found out from the waveform characteristic of the magnetic field sensing signal shown in FIG. 14 are listed in following Table (6).

TABLE (6)

Figure 14:
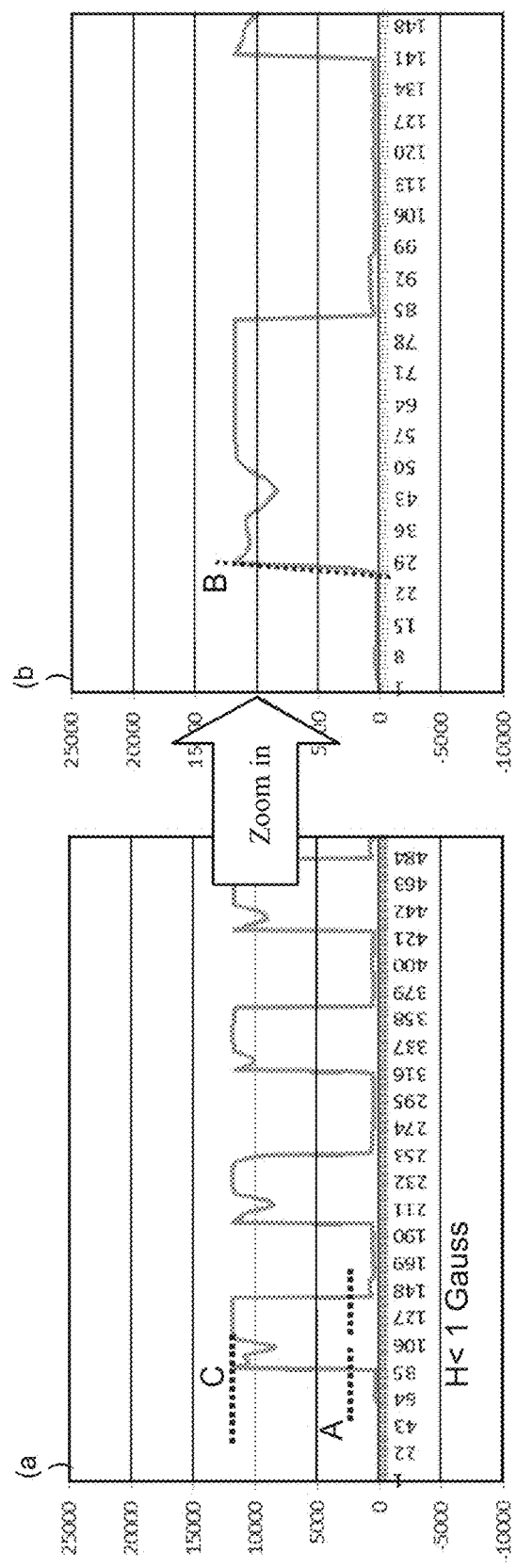
FIG. 14 shows a waveform graph of the magnetic field sensing signal measured from a fourth commercial battery.

| Symbol in FIG. 14 | feature parameters | Value |
|---|---|---|
| A | Starting level of the magnetic field signal | >5 Gauss |
| B | Slop of discharge | <5 Gauss/ms |
| C | maximum intensity of of the magnetic field signal | <15 Gauss |
| H | Charge level | ~0 Gauss |
| — | Battery voltage | <12.5 V |

Figure 15:
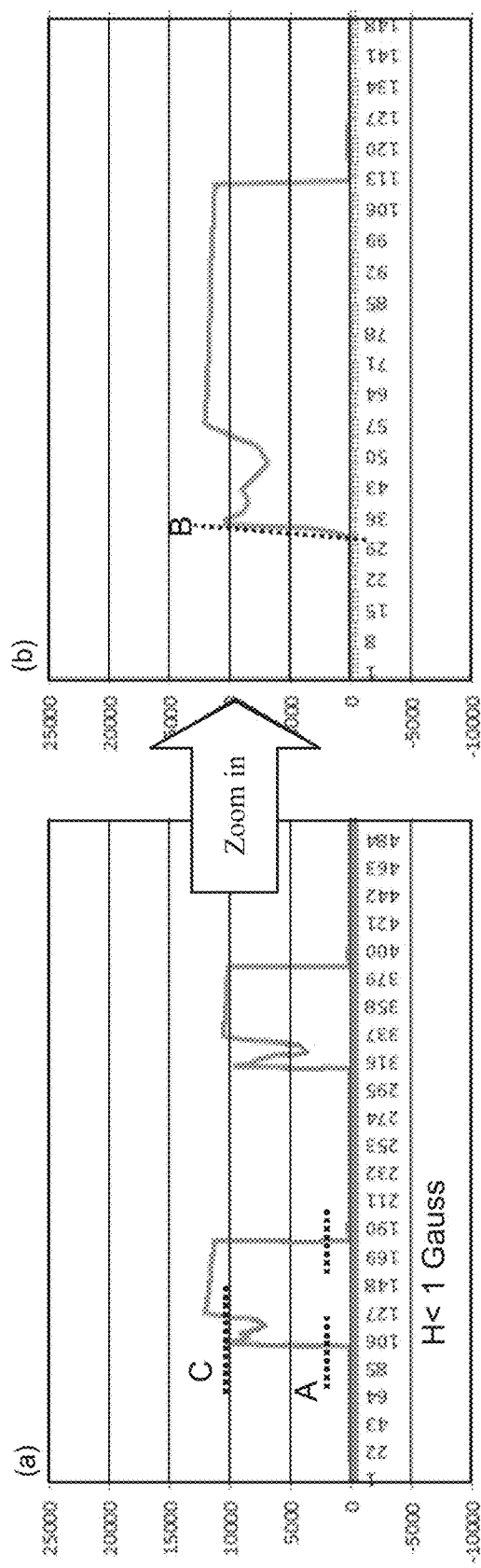
FIG. 15 shows a waveform graph of the magnetic field sensing signal measured from a fifth commercial battery.

Thus, after applying a feature mapping treatment to the measured feature parameters and a plurality of reference parameters listed in above Table (2), the health state of the fourth commercial battery is estimated to be bad, and that means this used battery must be replaced by a new one. Finally, FIG. 15 shows a waveform graph of a magnetic field sensing signal measured from a fifth commercial battery. Therefore, the feature parameters found out from the waveform characteristic of the magnetic field sensing signal shown in FIG. 15 are listed in following Table (7).

TABLE (7)

| Symbol in FIG. 15 | feature parameters | Value |
|---|---|---|
| A | Starting level of the magnetic field signal | >5 Gauss |
| B | Slop of discharge | <5 Gauss/ms |
| C | maximum intensity of of the magnetic field signal | <15 Gauss |
| H | Charge level | ~0 Gauss |
| — | Battery voltage | <12.5 V |

Therefore, after applying a feature mapping treatment to the measured feature parameters and a plurality of reference parameters listed in above Table (2), the health state of the fifth commercial battery is estimated to be bad, and that means this used battery must be replaced by a new one.

Figure 1:
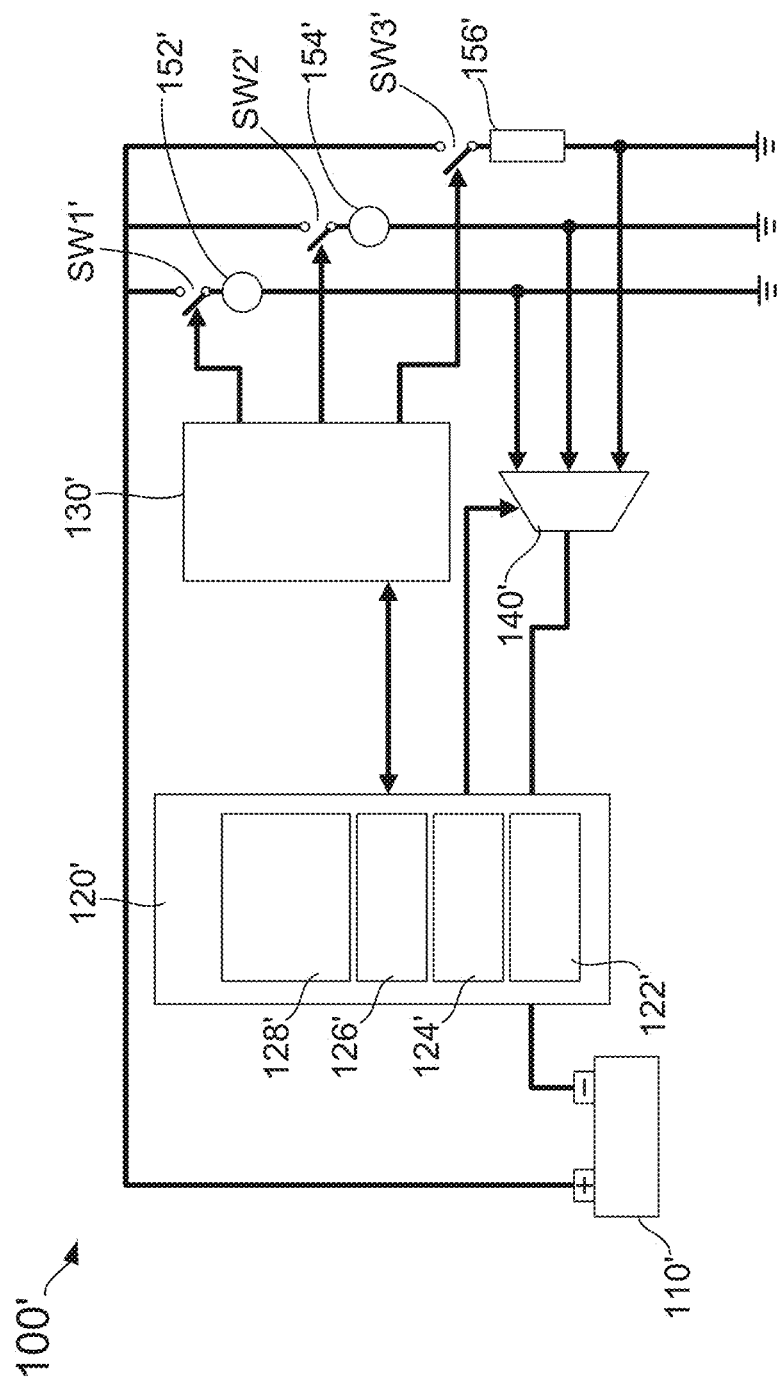
FIG. 1 shows a framework diagram of a conventional intelligent battery monitoring system.

Therefore, through above descriptions, the non-contact intelligent battery sensing system and method provided by the present invention has been introduced completely and clearly; in summary, the present invention includes the advantages of:

(1) The manufacturing cost of the intelligent battery monitoring system 100' (as shown by FIG. 1) is high because of having at least three integrated chips (ICs). In view of that, the present invention proposes a non-contact intelligent battery sensing system 1 (as shown by FIG. 2A) having the advantage of low manufacturing cost. The non-contact intelligent battery sensing system 1 mainly comprises a first magnetic field sensor 11 and a sensor controlling module 12.

(2) Differing from the intelligent battery monitoring system 100' utilizing current signal measured from vehicle battery to calculate data of SoH and SoC, the non-contact intelligent battery sensing system 1 uses the first magnetic field sensor 11 to obtain a magnetic field sensing signal, so as to facilitate the sensor controlling module 12 be able to find out a plurality of feature parameters from a waveform characteristic of the magnetic field sensing signal, such that the battery state of the vehicle battery can be estimated by the sensor controlling module 12 based on the feature parameters. Therefore, as long as the battery state indicates that the vehicle battery is classified as a bad battery, it is easy for the driver to know that the vehicle battery must be replaced by a new one.

(3) In view of the driver cannot equip his vehicle with conventional intelligent battery monitoring system 100' by himself because the wire connections of the intelligent battery monitoring system 100' are complex, this non-contact intelligent battery sensing system 1 simultaneously shows the advantage of simple circuit framework. Since the non-contact intelligent battery sensing system 1 only comprises a first magnetic field sensor 11 and a sensor controlling module 12, it is very easy for the driver to equip his vehicle with this non-contact intelligent battery sensing system by himself. In fact, to apply the non-contact intelligent battery sensing system 1, the driver just needs to firstly dispose the first magnetic field sensor 11 at one position near to a power line 21 of a battery 2 to be sensed, and then install a sensor controlling application program (i.e. the sensor controlling module 12) in his smart phones. Apparently, this non-contact intelligent battery sensing system 1 is indeed easily to be installed.

The above description is made on embodiments of the present invention. However, the embodiments are not intended to limit scope of the present invention, and all equivalent implementations or alterations within the spirit of the present invention still fall within the scope of the present invention.

What is claimed is:

1. A non-contact intelligent battery sensing system, comprising:
   a first magnetic field sensor, being disposed near a power line of a battery, and used for sensing a magnetic field formed around the power line so as to correspondingly output a magnetic field sensing signal; and
   a sensor controlling module, being coupled to the first magnetic field sensor for receiving the magnetic field sensing signal, and comprising:
      a storage unit for storing the received magnetic field sensing signal;
      a microprocessor, being coupled to the storage unit and comprising a feature parameter verifying unit and a battery state estimation unit; wherein the feature parameter verifying unit is configured to find out a plurality of feature parameters from a waveform characteristic of the magnetic field sensing signal, such that the battery state estimation unit is able to estimate a battery state according to the feature parameters; and
      an output unit, being coupled to the microprocessor for outputting the battery state to an external electronic device.

2. The non-contact intelligent battery sensing system of claim 1, wherein the external electronic device is selected from the group consisting of: notebook, tablet PC, smart phone, and electronic control unit (ECU).

3. The non-contact intelligent battery sensing system of claim 1, wherein the output unit is selected from the group consisting of: wireless transmission interface and wire transmission interface.

4. The non-contact intelligent battery sensing system of claim 1, wherein the sensor controlling module is applied in the external electronic device by a form of software or a form of firmware.

5. The non-contact intelligent battery sensing system of claim 1, wherein the microprocessor further comprises:
   a feature mapping unit, being coupled to the feature parameter verifying unit for applying a feature mapping treatment to the plurality of feature parameters and a plurality of reference parameters;
   wherein the battery state estimation unit is coupled to the feature mapping unit, so as to estimate the battery state according to a feature mapping data provided by the feature mapping unit.

6. The non-contact intelligent battery sensing system of claim 1, wherein the feature parameters comprises: starting level of the magnetic field signal, maximum intensity of the magnetic field signal, ending level of the magnetic field signal, polarity of the magnetic field signal, discharge time, slope of discharge, charge time, charge level, and slope of charge.

7. The non-contact intelligent battery sensing system of claim 1, further comprising:
   a voltage sensor, being coupled to the sensor controlling module and electrically connected to the battery.

8. The non-contact intelligent battery sensing system of claim 1, wherein a battery internal resistance is measured by using the sensor controlling module to input a resistance detecting signal into the battery.

9. The non-contact intelligent battery sensing system of claim 1, further comprising:
   a magnetic field shielding ring for housing the first magnetic field sensor, wherein a noise magnetic field is blocked out of the magnetic field shielding ring by making the power line pass through the magnetic field shielding ring.

10. The non-contact intelligent battery sensing system of claim 9, further comprising:
    a second magnetic field sensor, being coupled to the sensor controlling module and disposed near the power line and located at a position outside the magnetic field shielding ring, used for sensing the noise magnetic field formed outside the magnetic field shielding ring.

11. The non-contact intelligent battery sensing system of claim 10, wherein both the first magnetic field sensor and the second magnetic field sensor have a signal outputting unit selected from the group consisting of: wireless outputting interface and wire outputting interface.

12. A non-contact intelligent battery sensing method, comprising following steps:
    (1) using a sensor controlling module comprising a feature parameter verifying unit and a battery state estimation unit to control a first magnetic field sensor to sense a magnetic field formed around a power line of a battery, and then receiving a magnetic field sensing signal outputted by the first magnetic field sensor;
    (2) finding out a plurality of feature parameters from a waveform characteristic of the magnetic field sensing signal by using the feature parameter verifying unit of the sensor controlling module, so as to facilitate the battery state estimation unit estimate a battery state according to the feature parameters; and
    (3) outputting the battery state to an external electronic device through an output unit coupled to the sensor controlling module.

13. The non-contact intelligent battery sensing method of claim 12, further comprising following additional steps between the step (1) and the step (2):
- (1a) determining whether the magnetic field sensing signal is normal or not; if yes, proceeding to the step (2); otherwise, proceeding to step (1b);
- (1b) using the sensor controlling module to control a second magnetic field sensor to sense an external magnetic field; wherein the first magnetic field sensor is accommodated in a magnetic field shielding ring, and the second magnetic field sensor is coupled to the sensor controlling module, and further disposed near the power line and located at a specific position outside the magnetic field shielding ring;
- (1c) determining whether or not the external magnetic field sensing signal is a noise magnetic field signal by comparing the first magnetic field sensing signal with the external magnetic field sensing signal; if yes, proceeding to step (1d); otherwise, proceeding back to the step (1);
- (1d) adjusting the position of the first magnetic field sensor, and then repeating the step (1).

14. The non-contact intelligent battery sensing method of claim 12, wherein the step (2) comprises following detail steps:

- (21) recording the feature parameters of discharge time, slope of discharge and maximum intensity of the magnetic field signal when the level of the magnetic field sensing signal is greater than a starting level;
- (22) determining whether or not the waveform characteristic of the magnetic field sensing signal is an enable waveform characteristic based on the feature parameters of discharge time, slope of discharge and maximum intensity of the magnetic field signal; if yes, proceeding to step (23); otherwise, proceeding back to the step (1);
- (23) recording the feature parameters of polarity of the magnetic field signal, slope of charge and charge time;
- (24) stopping verifying and recording the feature parameters when the level of the magnetic field sensing signal is lower than an ending level;
- (25) applying a feature mapping treatment to the plurality of feature parameters and a plurality of reference parameters by using a feature mapping unit of the sensor controlling module, so as to facilitate the battery state estimation unit estimate the battery state according to a feature mapping data provided by the feature mapping unit.

* * * * *